(12) United States Patent
Hwang et al.

(10) Patent No.: US 10,643,530 B2
(45) Date of Patent: May 5, 2020

(54) AMOLED DISPLAY DEVICE AND DRIVING METHOD THEREOF

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventors: Taijiun Hwang, Guangdong (CN); Zhenling Wang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 264 days.

(21) Appl. No.: 15/736,119

(22) PCT Filed: Nov. 20, 2017

(86) PCT No.: PCT/CN2017/111972
§ 371 (c)(1),
(2) Date: Dec. 13, 2017

(87) PCT Pub. No.: WO2019/071726
PCT Pub. Date: Apr. 18, 2019

(65) Prior Publication Data
US 2019/0385518 A1    Dec. 19, 2019

(30) Foreign Application Priority Data

Oct. 9, 2017   (CN) .......................... 2017 1 0931773

(51) Int. Cl.
*G09G 3/3233* (2016.01)
*H01L 27/32* (2006.01)
(Continued)

(52) U.S. Cl.
CPC ....... *G09G 3/3233* (2013.01); *H01L 27/3246* (2013.01); *H01L 27/3248* (2013.01);
(Continued)

(58) Field of Classification Search
CPC combination set(s) only.
See application file for complete search history.

(56) References Cited

U.S. PATENT DOCUMENTS

2004/0021413 A1*  2/2004  Ito ..................... H01L 27/3246
                                                          313/504
2006/0061525 A1*  3/2006  Kim .................... G09G 3/3233
                                                          345/76
(Continued)

FOREIGN PATENT DOCUMENTS

CN        102044554        5/2011
CN        105932166        9/2016
(Continued)

*Primary Examiner* — Robin J Mishler
(74) *Attorney, Agent, or Firm* — Hemisphere Law, PLLC; Zhigang Ma

(57) ABSTRACT

An AMOLED display device and driving method thereof is provided. In the AMOLED display device, the anode layer on the pixel area comprises a first anode and a second anode formed around and separated from the first anode, the first sub OLED is composed of the first anode, the OLED functional layer and the cathode on the first anode, and the second sub OLED is composed of the second anode, the OLED functional layer and the cathode on the second anode; for each pixel area, a pixel driving circuit is formed correspondingly; the pixel driving circuit is coupled to the first and the second anode; when operated, the pixel driving circuit sends the first current and the second current different from the first current to the first anode and the second anode so that the luminance strength of the first sub OLED and the second sub OLED is the same.

7 Claims, 5 Drawing Sheets

(51) Int. Cl.
*H01L 51/52* (2006.01)
*H01L 27/12* (2006.01)

(52) U.S. Cl.
CPC ...... *H01L 27/3258* (2013.01); *H01L 27/3262* (2013.01); *H01L 27/3265* (2013.01); *H01L 51/5212* (2013.01); *H01L 51/5225* (2013.01); G09G 2320/0233 (2013.01); H01L 27/1248 (2013.01); H01L 27/1255 (2013.01); H01L 2251/558 (2013.01)

(56) References Cited

U.S. PATENT DOCUMENTS

| | | |
|---|---|---|
| 2013/0119352 A1 | 5/2013 | Aurongzeb |
| 2017/0005151 A1* | 1/2017 | Kim ................... H01L 27/3246 |
| 2017/0207281 A1 | 7/2017 | Hack et al. |
| 2019/0221620 A1* | 7/2019 | Li ...................... H01L 27/3246 |

FOREIGN PATENT DOCUMENTS

| | | |
|---|---|---|
| CN | 106328679 | 1/2017 |
| CN | 206947383 | 1/2018 |

\* cited by examiner

AMOLED DISPLAY DEVICE AND DRIVING METHOD THEREOF

RELATED APPLICATIONS

The present application is a National Phase of International Application Number PCT/CN2017/111972, filed on Nov. 20, 2017, and claims the priority of China Application No. 201710931773.5, filed on Oct. 9, 2017.

FIELD OF THE DISCLOSURE

The disclosure relates to a display technical field, and more particularly to an AMOLED display device and driving method thereof.

BACKGROUND

Organic Light Emitting Display (OLED) has the advantages of self-luminous, low driving voltage, high luminous efficiency, short response time, high sharpness, high contrast, nearly 180° viewing angle, wide temperature range, flexible display, Large-area panchromatic display, etc., and is recognized as the most promising display device by the manufacturers.

The OLED can be divided, according to driving method, into two categories: passive matrix OLED (PMOLED) and active matrix OLED (AMOLED), i.e., direct addressing and TFT array addressing. Wherein, AMOLED contains pixels arranged as an array, belongs to the active display type, is with high luminance efficiency, and is usually used as a large size display device with high sharpness.

AMOLED is a current-driven device. When current flows through the organic light emitting diode, the organic light emitting diode emits light, and luminance strength is determined by the current flowing through the organic light emitting diode. Most existed integrated circuits (ICs) only transmit voltage signal, therefore the pixel driving circuit of the AMOLED has to convert a voltage signal into a current signal. A conventional pixel driving circuit of the AMOLED usually has 2T1C, that is, a structure composed of two thin film transistors and one capacitor, to convert the voltage into current.

Usually, a plurality of pixel separating banks are formed on a planarization layer of the TFT array substrate of the AMOLED display device nowadays, a plurality of pixel areas on the TFT array substrate are defined by the pixel separating banks, and OLED functional layer is printed on the pixel areas thereafter. Specifically, the OLED material in solution state is dropped into the pixel areas, and then, the OLED material is dried to obtain the OLED functional layer. Because the organic materials used for forming the pixel separating banks generally are hydrophilic or hydrophobic, the thickness of the OLED functional layer near the center of the pixel area is smaller than the thickness of the OLED functional layer near the boundaries of the pixel area when the OLED functional layer is formed by printing and the materials forming the pixel separating banks are hydrophilic, or the thickness of the OLED functional layer near the center of the pixel area is larger than the thickness of the OLED functional layer near the boundaries of the pixel area when the OLED functional layer is formed by printing and the materials forming the pixel separating banks are hydrophobic. That is, the thickness of the OLED functional layer is uneven. When the AMOLED display device based on the OLED functional layer above is driven to display, the luminance strength in the same pixel area would be different when the current flows through the OLED functional layer with uneven thickness, and the display quality is therefore affected.

SUMMARY

One object of the present invention is to provide an AMOLED display device having even luminance strength in each pixel area and high display quality.

Another object of the present invention is to provide a driving method of AMOLED display device so that the luminance strength in each pixel area is even when the AMOLED display device is operated, and the display quality of the AMOLED display device is improved.

In order to achieve one object described above, the present invention first provides an AMOLED display device, comprising: a TFT substrate; a plurality of pixel separating banks arranged on the TFT substrate, a plurality of OLED functional layers arranged on the TFT substrate; and a cathode arranged on the OLED functional layers; wherein, the pixel separating banks defines a plurality of pixel areas on the TFT substrate, and the OLED functional layers are formed on the pixel areas, respectively;

wherein, the TFT substrate comprises a substrate; a TFT array layer formed on the substrate; and a plurality of anode layers formed on the TFT array layer and correspondingly on the pixel areas;

wherein, each anode layer comprises: a first anode formed on center of a corresponding one of the pixel areas; and a second anode separated from and formed around the first anode; wherein a first sub OLED is composed of the first anode and the OLED functional layer and the cathode on the first anode, and a second sub OLED is composed of the second anode and the OLED functional layer and the cathode on the second anode;

wherein, for each one of the pixel areas, a pixel driving circuit is formed correspondingly in the AMOLED display device; the pixel driving circuit is electrically coupled to the first anode and the second anode, respectively; and, when the AMOLED display device is operated, the pixel driving circuit is used to send a first current and a second current to the first anode and the second anode, respectively, to drive the first sub OLED and the second sub OLED to illuminate light to keep luminance strength of the first sub OLED and the second sub OLED to be the same.

In one embodiment, materials forming the pixel separating banks are hydrophilic, a thickness of the OLED functional layer corresponding to the first anode is smaller than the thickness of the OLED functional layer corresponding to the second anode; and the first current is smaller than the second current.

In one embodiment, materials forming the pixel separating banks are hydrophobic, a thickness of the OLED functional layer corresponding to the first anode is larger than the thickness of the OLED functional layer corresponding to the second anode; and the first current is larger than the second current.

In one embodiment, each pixel driving circuit comprises a first TFT, a second TFT, a third TFT, a fourth TFT, a first capacitor and a second capacitor;

wherein the first TFT, the second TFT, the third TFT, the fourth TFT, the first capacitor and the second capacitor are in the TFT array layer; a gate of the first TFT is coupled to receive a scan signal, a source of the first TFT is coupled to receive a first data signal, and a drain of the first TFT is electrically coupled to a gate of the second TFT; a drain of the second TFT is coupled to receive a positive power source, and a source of the second TFT is electrically coupled to the first anode in the corresponded pixel area; a gate of the third TFT is electrically coupled to the gate of the first TFT, a source of the third TFT is coupled to receive a second data signal, and a drain of the third TFT is electrically coupled to a gate of the fourth TFT; a drain of the fourth TFT is coupled to receive the positive power source, and a source of the fourth TFT is electrically coupled to the second anode in the corresponded pixel area; two terminals of the first capacitor are electrically coupled to the gate and the drain of the second TFT, respectively; and two terminals of the second capacitor are electrically coupled to the gate and the drain of the fourth TFT;

the cathode is coupled to receive a negative power source;

when the AMOLED display device is operated, the first TFT and the third TFT are turned on by the scan signal, and the first current and the second current are generated and are fed to the first anode and the second anode, respectively, in correspondence to inputting the first data signal and the second data signal to the gate of the second TFT and the gate of the fourth TFT, respectively.

In one embodiment, the TFT substrate further comprises a planarization layer formed between the anode layers and the TFT array layer.

In one embodiment, a thickness of an area of the planarization layer corresponding to the first anode is smaller than a thickness of an area of the planarization layer corresponding to the second anode.

The present invention further provides a driving method of AMOLED display device, comprising:

step S1, providing an AMOLED display device;
  wherein, the AMOLED display device comprises: a TFT substrate; a plurality of pixel separating banks arranged on the TFT substrate, a plurality of OLED functional layers arranged on the TFT substrate; and a cathode arranged on the OLED functional layers; wherein, the pixel separating banks defines a plurality of pixel areas on the TFT substrate, and the OLED functional layers are formed on the pixel areas, respectively;
  wherein, the TFT substrate comprises a substrate; a TFT array layer formed on the substrate; and a plurality of anode layers formed on the TFT array layer and correspondingly on the pixel areas;
  wherein, each anode layer comprises; a first anode formed on center of a corresponding one of the pixel areas; and a second anode separated from and formed around the first anode; wherein a first sub OLED is composed of the first anode and the OLED functional layer and the cathode on the first anode, and a second sub OLED is composed of the second anode and the OLED functional layer and the cathode on the second anode;
  wherein, for each one of the pixel areas, a pixel driving circuit is formed correspondingly in the AMOLED display device; the pixel driving circuit is electrically coupled to the first anode and the second anode, respectively; and
step S2, displaying by the AMOLED display device, wherein the pixel driving circuit sends a first current and a second current to the first anode and the second anode, respectively, to drive the first sub OLED and the second sub OLED to illuminate light to keep luminance strength of the first sub OLED and the second sub OLED to be the same.

In one embodiment, materials forming the pixel separating banks are hydrophilic, a thickness of the OLED functional layer corresponding to the first anode is smaller than the thickness of the OLED functional layer corresponding to the second anode; and the first current is smaller than the second current in the step S2.

In one embodiment, materials forming the pixel separating banks are hydrophobic, a thickness of the OLED functional layer corresponding to the first anode is larger than the thickness of the OLED functional layer corresponding to the second anode; and the first current is larger than the second current in the step S2.

In one embodiment, each pixel driving circuit comprises a first TFT, a second TFT, a third TFT, a fourth TFT, a first capacitor and a second capacitor;
  wherein the first TFT, the second TFT, the third TFT, the fourth TFT, the first capacitor and the second capacitor are in the TFT array layer; a gate of the first TFT is coupled to receive a scan signal, a source of the first TFT is coupled to receive a first data signal, and a drain of the first TFT is electrically coupled to a gate of the second TFT; a drain of the second TFT is coupled to receive a positive power source, and a source of the second TFT is electrically coupled to the first anode in the corresponded pixel area; a gate of the third TFT is electrically coupled to the gate of the first TFT, a source of the third TFT is coupled to receive a second data signal, and a drain of the third TFT is electrically coupled to a gate of the fourth TFT; a drain of the fourth TFT is coupled to receive the positive power source, and a source of the fourth TFT is electrically coupled to the second anode in the corresponded pixel area; two terminals of the first capacitor are electrically coupled to the gate and the drain of the second TFT, respectively; and two terminals of the second capacitor are electrically coupled to the gate and the drain of the fourth TFT;
  the cathode is coupled to receive a negative power source;
  in the step S2, when the AMOLED display device is operated, the first TFT and the third TFT are turned on by the scan signal, and the first current and the second current are generated and are fed to the first anode and the second anode, respectively, in correspondence to inputting the first data signal and the second data signal to the gate of the second TFT and the gate of the fourth TFT, respectively.

The present invention further provides an AMOLED display device, comprising: a TFT substrate; a plurality of pixel separating banks arranged on the TFT substrate, a plurality of OLED functional layers arranged on the TFT substrate; and a cathode arranged on the OLED functional layers; wherein, the pixel separating banks defines a plurality of pixel areas on the TFT substrate, and the OLED functional layers are formed on the pixel areas, respectively;
  wherein, the TFT substrate comprises a substrate; a TFT array layer formed on the substrate; and a plurality of anode layers formed on the TFT array layer and correspondingly on the pixel areas;
  wherein, each anode layer comprises: a first anode formed on center of a corresponding one of the pixel areas; and a second anode separated from and formed around the first anode; wherein a first sub OLED is composed of the first anode and the OLED functional layer and the cathode on the first anode, and a second sub OLED is composed of the second anode and the OLED functional layer and the cathode on the second anode;

wherein, for each one of the pixel areas, a pixel driving circuit is formed correspondingly in the AMOLED display device; the pixel driving circuit is electrically coupled to the first anode and the second anode, respectively; and, when the AMOLED display device is operated, the pixel driving circuit is used to send a first current and a second current to the first anode and the second anode, respectively, to drive the first sub OLED and the second sub OLED to illuminate light to keep luminance strength of the first sub OLED and the second sub OLED to be the same;

wherein materials forming the pixel separating banks are hydrophilic, a thickness of the OLED functional layer corresponding to the first anode is smaller than the thickness of the OLED functional layer corresponding to the second anode; and the first current is smaller than the second current;

wherein each pixel driving circuit comprises a first TFT, a second TFT, a third TFT, a fourth TFT, a first capacitor and a second capacitor;

wherein the first TFT, the second TFT, the third TFT, the fourth TFT, the first capacitor and the second capacitor are in the TFT array layer; a gate of the first TFT is coupled to receive a scan signal, a source of the first TFT is coupled to receive a first data signal, and a drain of the first TFT is electrically coupled to a gate of the second TFT; a drain of the second TFT is coupled to receive a positive power source, and a source of the second TFT is electrically coupled to the first anode in the corresponded pixel area; a gate of the third TFT is electrically coupled to the gate of the first TFT, a source of the third TFT is coupled to receive a second data signal, and a drain of the third TFT is electrically coupled to a gate of the fourth TFT; a drain of the fourth TFT is coupled to receive the positive power source, and a source of the fourth TFT is electrically coupled to the second anode in the corresponded pixel area; two terminals of the first capacitor are electrically coupled to the gate and the drain of the second TFT, respectively; and two terminals of the second capacitor are electrically coupled to the gate and the drain of the fourth TFT;

the cathode is coupled to receive a negative power source;

when the AMOLED display device is operated, the first TFT and the third TFT are turned on by the scan signal, and the first current and the second current are generated and are fed to the first anode and the second anode, respectively, in correspondence to inputting the first data signal and the second data signal to the gate of the second TFT and the gate of the fourth TFT, respectively;

wherein the TFT substrate further comprises a planarization layer formed between the anode layers and the TFT array layer; wherein a thickness of an area of the planarization layer corresponding to the first anode is smaller than a thickness of an area of the planarization layer corresponding to the second anode.

The beneficial effect of the present invention is that, in the AMOLED display device provided in the present invention, the anode layer on the pixel area comprises the first anode and the second anode formed around and separated from the first anode, the first sub OLED is composed of the first anode and the OLED functional layer and the cathode on the first anode, and the second sub OLED is composed of the second anode and the OLED functional layer and the cathode on the second anode; for each one of the pixel areas, a pixel driving circuit is formed correspondingly; the pixel driving circuit is coupled to the first anode and the second anode, respectively; when operated, the pixel driving circuit sends the first current and the second current different from the first current to the first anode and the second anode so that the luminance strength of the first sub OLED and the second sub OLED is the same through controlling values of the first current and the second current, and the problem of uneven luminance strength due to uneven thickness of the OLED functional layer due to forming the OLED functional layer by printing method is solved, and the display quality is improved. The driving method of AMOLED display device makes the luminance strength in each pixel area to be even when the AMOLED display device is operated, and improves the display quality of the AMOLED display device.

BRIEF DESCRIPTION OF THE DRAWINGS

Please refer to the detailed description and drawings below for further understanding of the features and technique solutions of the present invention. Apparently, the drawings in the description below are merely for reference and explanation, but not for limiting the present invention.

In the figures.

DETAILED DESCRIPTION OF PREFERRED EMBODIMENTS

Figure 1:
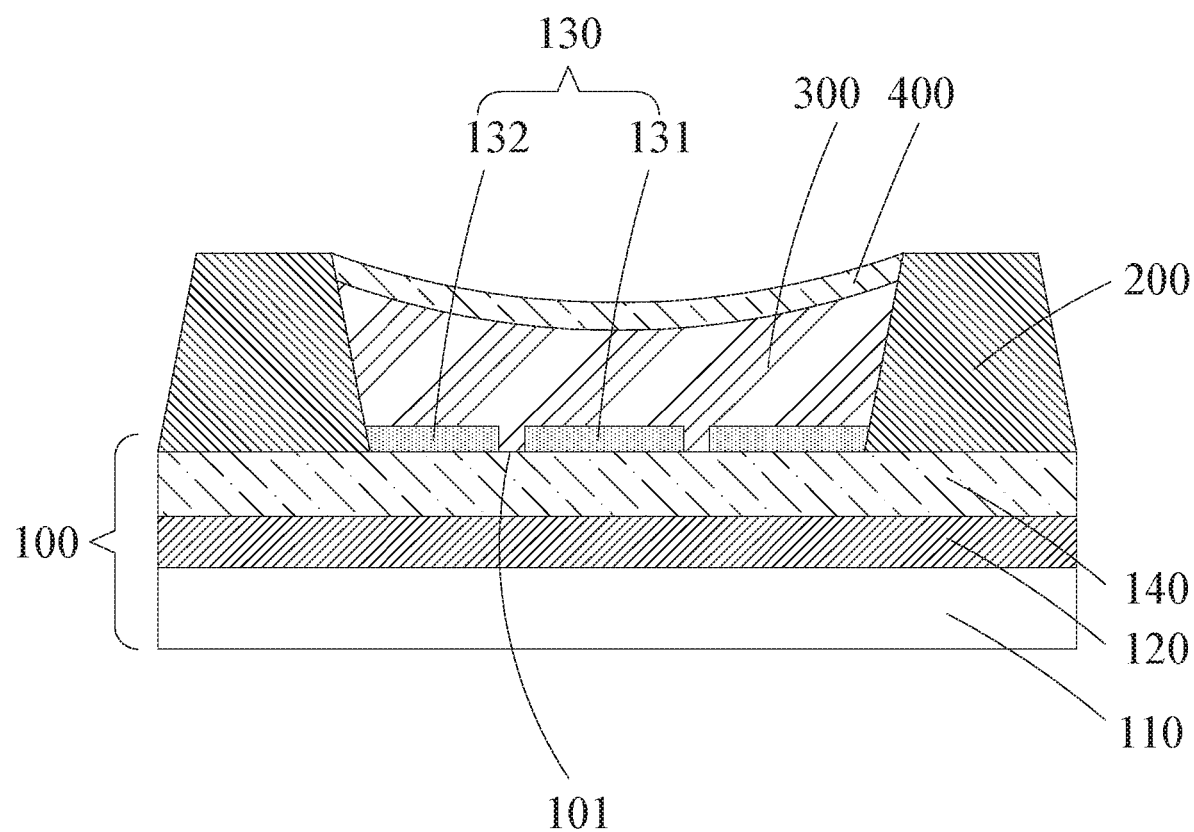
FIG. 1 is a structural schematic diagram according to a first embodiment of the AMOLED display device of the present invention.

In order to describing the technique solutions and the effects of the present invention, detailed descriptions are made below with reference to the preferred embodiments and the drawings.

The present invention provides an AMOLED display device. Please refer to FIG. 1 and FIG. 2, which shows a first embodiment of the AMOLED display device of the present invention. The AMOLED display device of the present invention comprises: a TFT substrate 100; a plurality of pixel separating banks 200 arranged on the TFT substrate 100, a plurality of OLED functional layers 300 arranged on the TFT substrate 100; and a cathode 400 arranged on the OLED functional layers 300; wherein, the pixel separating banks 200 defines a plurality of pixel areas 101 on the TFT substrate 100, and the OLED functional layers 300 are formed on the pixel areas 101, respectively.

The TFT substrate 100 comprises a substrate 110; a TFT array layer 120 formed on the substrate 110; and a plurality of anode layers 130 formed on the TFT array layer 120 and correspondingly on the pixel areas 101.

Each anode layer 130 comprises: a first anode 131 formed on center of a corresponding pixel area 101; and a second anode 132 separated from and formed around the first anode 131, wherein a first sub OLED D1 is composed of the first anode 131 and the OLED functional layer 300 and cathode 400 on the first anode 131, and a second sub OLED D2 is composed of the second anode 132 and the OLED functional layer 300 and the cathode 400 on the second anode 132.

For each pixel area 101, a pixel driving circuit 10 is formed correspondingly in the AMOLED display device. The pixel driving circuit 10 is electrically coupled to the first anode 131 and the second anode 132, respectively. When the AMOLED display device is operated, the pixel driving circuit 10 is used to send a first current and a second current to the first anode 131 and the second anode 132, respectively, to drive the first sub OLED D1 and the second sub OLED D2 to illuminate light, and to keep luminance strength of the first sub OLED D1 and the second sub OLED D2 to be the same.

Specifically, the OLED functional layer 300 comprises hole injection layer, hole transporting layer, light emitting layer, electron transporting layer and electron injection layer stacked from bottom to top in sequence. The OLED functional layer 300 is formed on the pixel area 101 by the method of printing.

It is noted that, the thickness of a central part of the OLED functional layer 300, which is located on center of the pixel area 101, is different from the thickness of a boundary part of the OLED functional layer 300, which is located near boundaries of the pixel area 101 because the pixel separating banks 200 generally are hydrophilic or hydrophobic. Accordingly, the anode layer 130 corresponding to each pixel area 101 is arranged to comprise the first anode 131 formed on the center of the pixel area 101 and the second anode 132 formed around and separated from the first anode 131. The first sub OLED D1 is composed of the first anode 131, the OLED functional layer 300 on the first anode 131 and the cathode 400 on the first anode 131, and the second sub OLED D2 is composed of the second anode 132, the OLED functional layer 300 on the second anode 132 and the cathode 400 on the second anode 132. For each pixel area 101, a pixel driving circuit 10 is formed correspondingly. The pixel driving circuit 10 is coupled to the first anode 131 and the second anode 132, respectively. When operated, the pixel driving circuit 10 sends the first current and the second current, which is different from the first current, to the first anode 131 and the second anode 132, so that the luminance strength of the first sub OLED D1 and the second sub OLED D2 could be the same through controlling values of the first current and the second current. In other words, although the thickness of the OLED functional layer 300 on the center of the pixel area 101 is different from that near the boundaries of the pixel area 101, the luminance strength in each pixel area 101 can be kept uniform, so that the problem of uneven luminance strength due to uneven thickness of the OLED functional layer 300 due to forming the OLED functional layer 300 by printing method is solved, and the display quality is improved.

Specifically, material of the substrate 110 could be glass.

Specifically, refer to FIG. 1, the TFT substrate 100 further comprises a planarization layer 140 formed between the anode layers 130 and the TFT array layer 120, and the pixel separating banks 200 are formed on the planarization layer 140. Specifically, in the first embodiment of the present invention, the surface of the planarization layer 140 is flat.

Specifically, the cathode 400 could fully cover the OLED functional layers 300 and the pixel separating banks 200, or, as the first embodiment of the present invention shown in FIG. 1, the cathode 400 is formed on the OLED functional layers 300, either of which does not affect performance of the present invention.

Specifically, refer to FIG. 1, in the first embodiment of the present invention, materials forming the pixel separating banks 200 are hydrophilic, therefore, after forming the OLED functional layers 300 by printing method, a thickness of a part of the OLED functional layer 300 which corresponds to the first anode 131 is smaller than the thickness of another part of the OLED functional layer 300 which corresponds to the second anode 132. Consequently, the first current sent to the first anode 131 from the pixel driving circuit 10 is smaller than the second current sent to the second anode 132 from the pixel driving circuit 10, so that the luminance strength of the first sub OLED D1 and the second sub OLED D2 could be the same.

Figure 2:
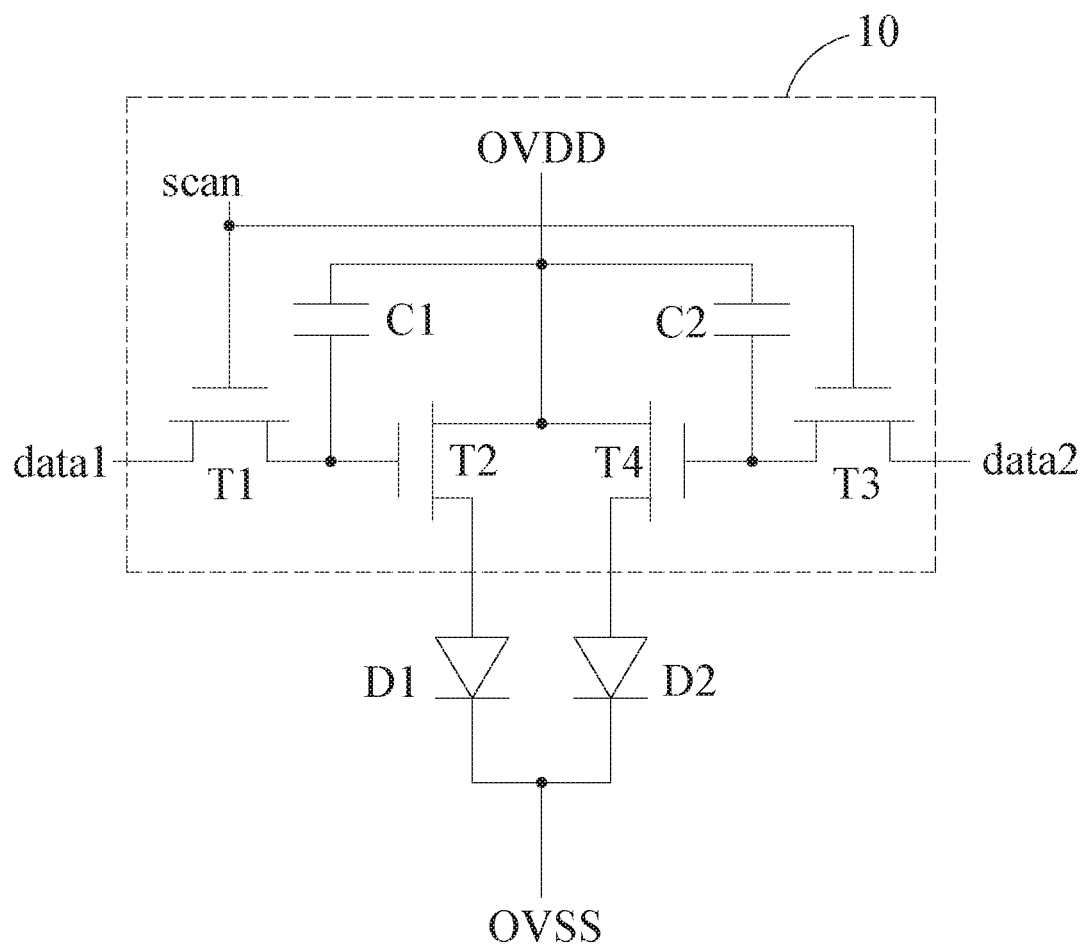
FIG. 2 is a circuit diagram showing connections between the pixel driving circuit, the first sub OLED and the second sub OLED of the AMOLED display device of the present invention.

Specifically, refer to FIG. 2, each pixel driving circuit 10 comprises a first TFT T1, a second TFT T2, a third TFT T3, a fourth TFT T4, a first capacitor C1 and a second capacitor C2.

Wherein, the first TFT T1, the second TFT T2, the third TFT T3, the fourth TFT T4, the first capacitor C1 and the second capacitor C2 are formed in the TFT array layer 120. A gate of the first TFT T1 is coupled to receive a scan signal scan, a source of the first TFT T1 is coupled to receive a first data signal data1, and a drain of the first TFT T1 is electrically coupled to a gate of the second TFT T2. A drain of the second TFT T2 is coupled to receive a positive power source OVDD, and a source of the second TFT T2 is electrically coupled to the first anode 131 in the corresponded pixel area 101. A gate of the third TFT T3 is electrically coupled to the gate of the first TFT T1, a source of the third TFT T3 is coupled to receive a second data signal data2, and a drain of the third TFT T3 is electrically coupled to a gate of the fourth TFT T4. A drain of the fourth TFT T4 is coupled to receive the positive power source OVDD, and a source of the fourth TFT T4 is electrically coupled to the second anode 132 in the corresponded pixel area 101, two terminals of the first capacitor C1 are electrically coupled to the gate and the drain of the second TFT T2, respectively, and two terminals of the second capacitor C2 are electrically coupled to the gate and the drain of the fourth TFT T4, respectively. The cathode 400 is coupled to receive a negative power source OVSS. When the AMOLED display device is operated, the first TFT T1 and the third TFT T3 are turned on by the scan signal Scan, and the first data signal data 1 and the second data signal data 2 are written to the gate of the second TFT T2 and the gate of the fourth TFT T4, respectively. By controlling the voltage values of the first data signal data1 and the second data signal data2, the current values of the first current and the second current generated by the pixel driving circuit 10 can be adjusted. The first current and the second current are further sent to the first anode 131 and the second anode 132 to drive the first sub OLED D1 and the second sub OLED D2 to illuminate light in a uniform strength.

Figure 3:
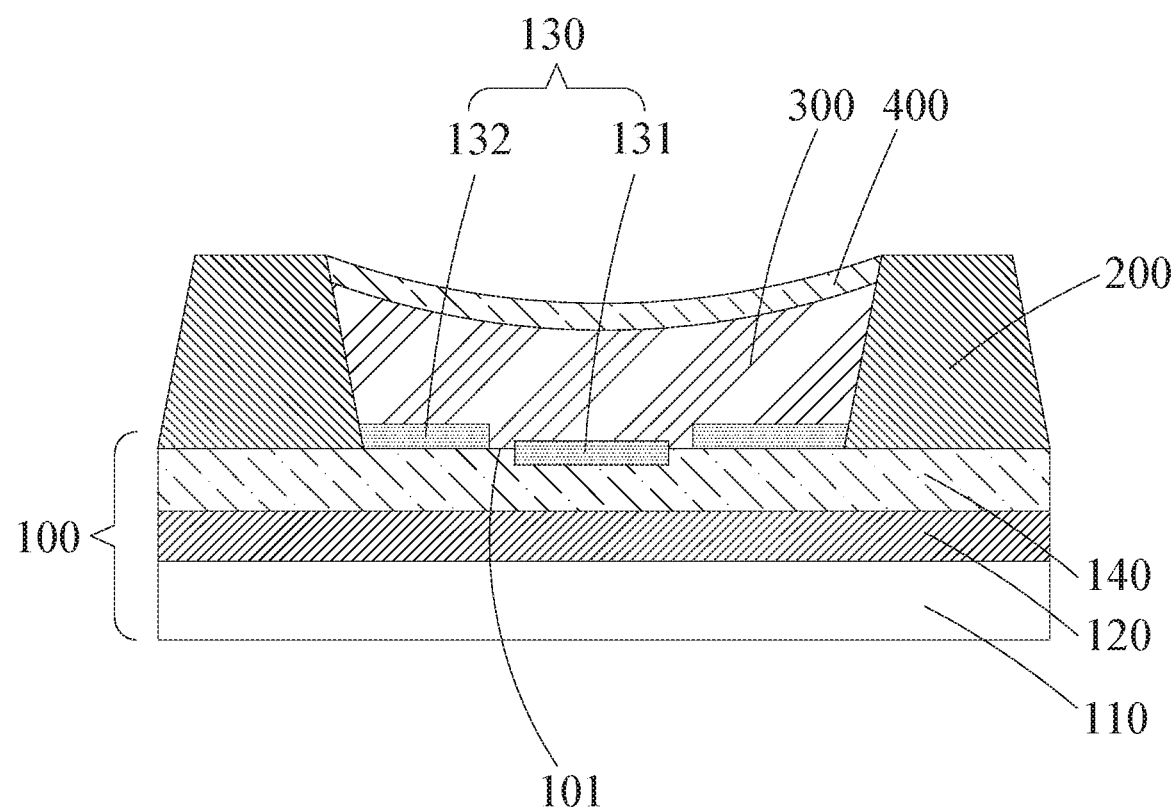
FIG. 3 is a structural schematic diagram according to a second embodiment of the AMOLED display device of the present invention.

Specifically, refer to FIG. 3, which is a second embodiment of the AMOLED display device of the present invention. This embodiment differs from the first embodiment described above in that the thickness of an area of the planarization layer 140 corresponding to the first anode 131 is smaller than the thickness of an area of the planarization layer 140 corresponding to the second anode 132, so that the different between the thickness of the part of the OLED functional layer 300 on the center of the pixel area 101 and the thickness of the part of the OLED functional layer 300 near the boundaries of the pixel area 101 can be reduced due to the step difference of the planarization layer 140. Therefore, the degree of non-uniform thickness of the OLED functional layer 300 due to forming the OLED functional layer 300 by printing is reduced, and the difference between the first current and the second current can be reduced so that the technology solution described above can be easily applied. Other technique features are the same as those of the first embodiment, and are not described again here.

Figure 4:
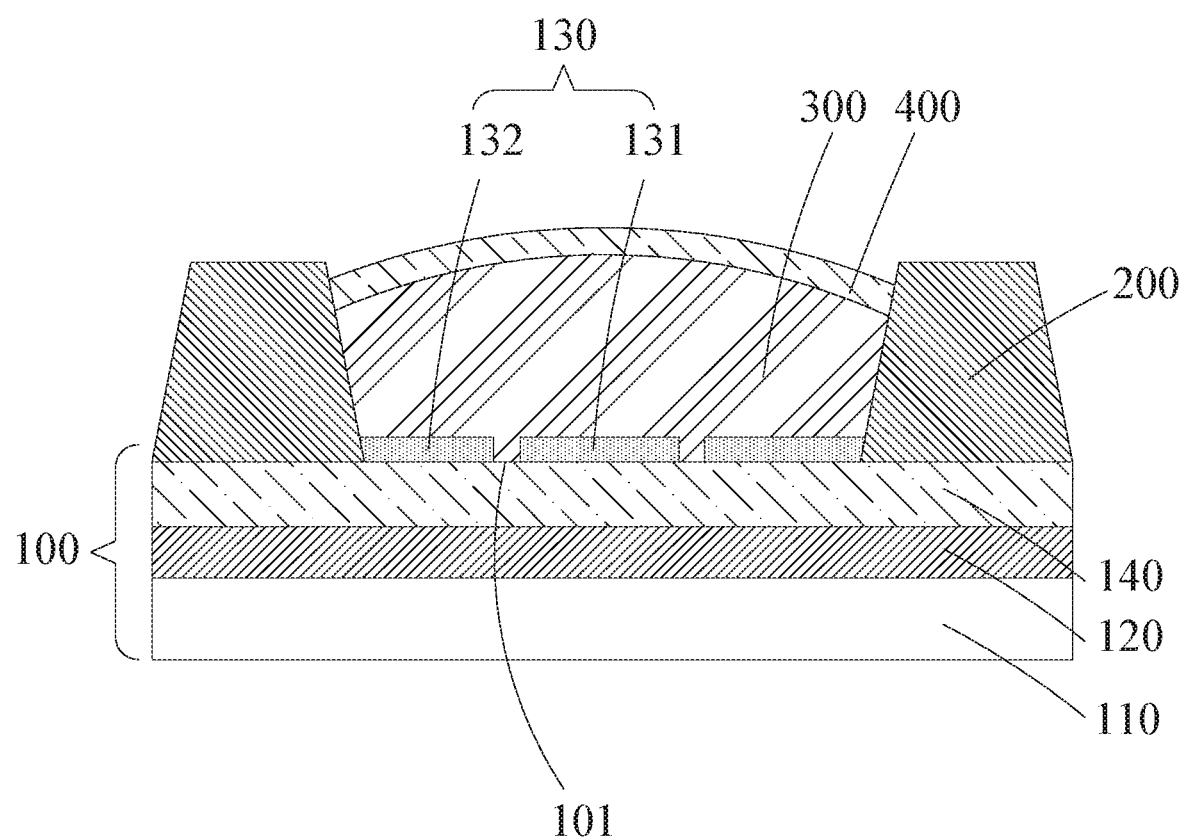
FIG. 4 is a structural schematic diagram according to a third embodiment of the AMOLED display device of the present invention.

Specifically, refer to FIG. 4, which is a third embodiment of the AMOLED display device of the present invention. This embodiment differs from the first embodiment described above in that materials forming the pixel separating banks 200 are hydrophobic, therefore, after forming the OLED functional layers 300 by printing, a thickness of a part of the OLED functional layer 300 which corresponds to the first anode 131 is larger than the thickness of another part of the OLED functional layer 300 which corresponds to the second anode 132. Consequently, the first current sent to the first anode 131 from the pixel driving circuit 10 is larger than the second current sent to the second anode 132 from the pixel driving circuit 10, so that the luminance strength of the first sub OLED D1 and the second sub OLED D2 could be the same. Other technique features are the same as those of the first embodiment, and are not described again here.

It is noted that, on the basis of the third embodiment of the present invention, the thickness of an area of the planarization layer 140 corresponding to the first anode 131 can be set to be larger than the thickness of an area of the planarization layer 140 corresponding to the second anode 132, so that the degree of non-uniform thickness of the OLED functional layer 300 due to forming the OLED functional layer 300 by printing is reduced, and the difference between the first current and the second current can be reduced so that the technology solution described above can be easily applied.

Figure 5:
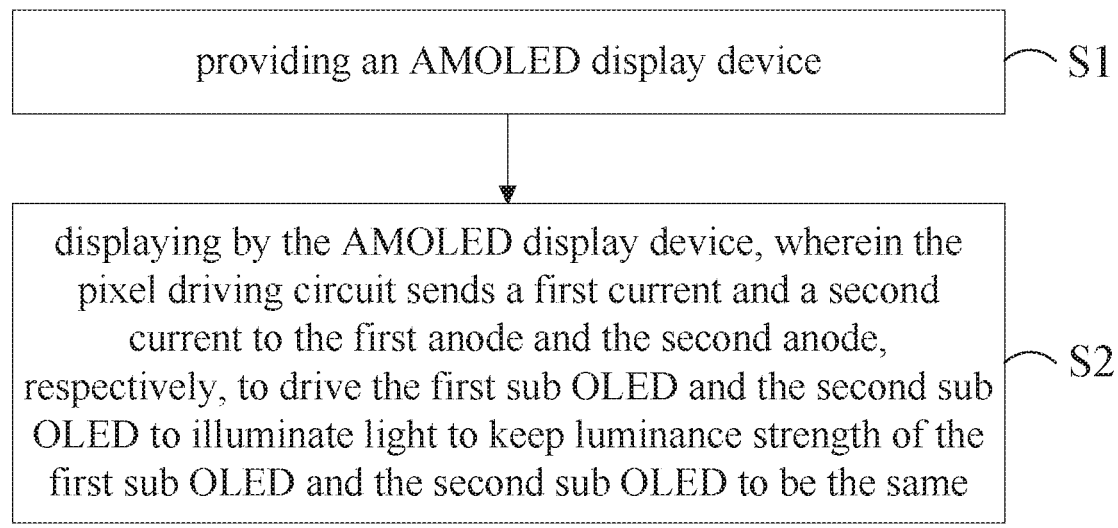
FIG. 5 is a flow chart of the driving method of the AMOLED display device of the present invention.

Please refer to FIG. 5. Basing on the same concept, the present invention further provides a driving method of AMOLED display device comprising the steps as follows:

Step S1, providing an AMOLED display device as shown in FIG. 1, FIG. 3 or FIG. 4.

The AMOLED display device comprises: a TFT substrate 100; a plurality of pixel separating banks 200 arranged on the TFT substrate 100, a plurality of OLED functional layers 300 arranged on the TFT substrate 100; and a cathode 400 arranged on the OLED functional layers 300; wherein, the pixel separating banks 200 defines a plurality of pixel areas 101 on the TFT substrate 100, and the OLED functional layers 300 are formed on the pixel areas 101, respectively.

The TFT substrate 100 comprises a substrate 110; a TFT array layer 120 formed on the substrate 110; and a plurality of anode layers 130 formed on the TFT array layer 120 and correspondingly on the pixel areas 101.

Each anode layer 130 comprises: a first anode 131 formed on center of a corresponding pixel area 101; and a second anode 132 separated from and formed around the first anode 131, wherein a first sub OLED D1 is composed of the first anode 131 and the OLED functional layer 300 and cathode 400 on the first anode 131, and a second sub OLED D2 is composed of the second anode 132 and the OLED functional layer 300 and the cathode 400 on the second anode 132.

For each pixel area 101, a pixel driving circuit 10 is formed correspondingly in the AMOLED display device. The pixel driving circuit 10 is electrically coupled to the first anode 131 and the second anode 132, respectively.

Specifically, material of the substrate 110 could be glass.

Specifically, the cathode 400 could fully cover the OLED functional layers 300 and the pixel separating banks 200, or, as shown in FIG. 1, FIG. 2 or FIG. 4, the cathode 400 is formed on the OLED functional layers 300, either of which does not affect performance of the present invention.

Specifically, the OLED functional layer 300 comprises hole injection layer, hole transporting layer, light emitting layer, electron transporting layer and electron injection layer stacked from bottom to top in sequence. The OLED functional layer 300 is formed on the pixel area 101 by the method of printing.

Specifically, refer to FIG. 2, each pixel driving circuit 10 comprises a first TFT T1, a second TFT T2, a third TFT T3, a fourth TFT T4, a first capacitor C1 and a second capacitor C2.

Wherein, the first TFT T1, the second TFT T2, the third TFT T3, the fourth TFT T4, the first capacitor C1 and the second capacitor C2 are formed in the TFT array layer 120. A gate of the first TFT T1 is coupled to receive a scan signal scan, a source of the first TFT T1 is coupled to receive a first data signal data1, and a drain of the first TFT T1 is electrically coupled to a gate of the second TFT T2. A drain of the second TFT T2 is coupled to receive a positive power source OVDD, and a source of the second TFT T2 is electrically coupled to the first anode 131 in the corresponded pixel area 101. A gate of the third TFT T3 is electrically coupled to the gate of the first TFT T1, a source of the third TFT T3 is coupled to receive a second data signal data2, and a drain of the third TFT T3 is electrically coupled to a gate of the fourth TFT T4. A drain of the fourth TFT T4 is coupled to receive the positive power source OVDD, and a source of the fourth TFT T4 is electrically coupled to the second anode 132 in the corresponded pixel area 101, two terminals of the first capacitor C1 are electrically coupled to the gate and the drain of the second TFT T2, respectively, and two terminals of the second capacitor C2 are electrically coupled to the gate and the drain of the fourth TFT T4, respectively. The cathode 400 is coupled to receive a negative power source OVSS.

Selectively, refer to FIG. 1, in the first embodiment of the present invention, materials forming the pixel separating banks 200 are hydrophilic, therefore, after forming the OLED functional layers 300 by printing method, a thickness of a part of the OLED functional layer 300 which corresponds to the first anode 131 is smaller than the thickness of another part of the OLED functional layer 300 which corresponds to the second anode 132.

Selectively, refer to FIG. 4, in the third embodiment of the present invention, materials forming the pixel separating banks 200 are hydrophobic, therefore, after forming the OLED functional layers 300 by printing, a thickness of a part of the OLED functional layer 300 which corresponds to the first anode 131 is larger than the thickness of another part of the OLED functional layer 300 which corresponds to the second anode 132.

Specifically, refer to FIG. 1, FIG. 3 or FIG. 4, the TFT substrate 100 further comprises a planarization layer 140 formed between the anode layers 130 and the TFT array layer 120, and the pixel separating banks 200 are formed on the planarization layer 140.

Furthermore, refer to FIG. 1 or FIG. 4, the surface of the planarization layer could be flat, or, refer to FIG. 3, when materials forming the pixel separating banks 200 are hydrophilic, it can be set that the thickness of an area of the planarization layer 140 corresponding to the first anode 131 is smaller than the thickness of an area of the planarization layer 140 corresponding to the second anode 132, so that the different between the thickness of the part of the OLED functional layer 300 on the center of the pixel area 101 and the thickness of the part of the OLED functional layer 300 near the boundaries of the pixel area 101 is reduced. When materials forming the pixel separating banks 200 are hydrophobic, it can be set that the thickness of an area of the planarization layer 140 corresponding to the first anode 131 is larger than the thickness of an area of the planarization layer 140 corresponding to the second anode 132, so that the different between the thickness of the part of the OLED functional layer 300 on the center of the pixel area 101 and the thickness of the part of the OLED functional layer 300 near the boundaries of the pixel area 101 is reduced.

Step S2, displaying by the AMOLED display device. The pixel driving circuit 10 sends a first current and a second current to the first anode 131 and the second anode 132, respectively, to drive the first sub OLED D1 and the second sub OLED D2 to illuminate light to keep luminance strength of the first sub OLED and the second sub OLED to be the same, Specifically, in the step S2, the first TFT T1 and the third TFT T3 are turned on by the scan signal Scan, and the first data signal data 1 and the second data signal data 2 are written to the gate of the second TFT T2 and the gate of the fourth TFT T4, respectively. By controlling the voltage values of the first data signal data1 and the second data signal data2, the current values of the first current and the second current generated by the pixel driving circuit 10 can be adjusted. The first current and the second current are further sent to the first anode 131 and the second anode 132 to drive the first sub OLED D1 and the second sub OLED D2 to illuminate light in a uniform strength.

Specifically, when materials forming the pixel separating banks 200 are hydrophilic, the first current is smaller than the second current in the step S2, and, when materials forming the pixel separating banks 200 are hydrophobic, the first current is larger than the second current in the step S2, It is noted that, because the pixel separating banks 200 might be hydrophilic or hydrophobic, the thickness of the OLED functional layer 300 near the center of the pixel area 101 is different from the thickness of the OLED functional layer 300 near the boundaries of the pixel area 101. Accordingly, in the driving method of AMOLED display device of the present invention, the anode layer 130 corresponding to each pixel area 101 is arranged to comprise the first anode 131 formed on the center of the pixel area 101 and the second anode 132 formed around and separated from the first anode 131. The first sub OLED D1 is composed of the first anode 131, the OLED functional layer 300 on the first anode 131 and the cathode 400 on the first anode 131, and the second sub OLED D2 is composed of the second anode 132, the OLED functional layer 300 on the second anode 132 and the cathode 400 on the second anode 132. For each pixel area 101, a pixel driving circuit 10 is formed correspondingly. The pixel driving circuit 10 is coupled to the first anode 131 and the second anode 132, respectively. When operated, the pixel driving circuit 10 sends the first current and the second current, which is different from the first current, to the first anode 131 and the second anode 132, so that the luminance strength of the first sub OLED D1 and the second sub OLED D2 could be the same through controlling values of the first current and the second current. In other words, although the thickness of the OLED functional layer 300 on the center of the pixel area 101 is different from that near the boundaries of the pixel area 101, the luminance strength in each pixel area 101 can be kept uniform, so that the problem of uneven luminance strength due to uneven thickness of the OLED functional layer 300 due to forming the OLED functional layer 300 by printing method is solved, and the display quality is improved, In summary, in the AMOLED display device provided in the present invention, the anode layer on the pixel area comprises the first anode and the second anode formed around and separated from the first anode, the first sub OLED is composed of the first anode and the OLED functional layer and the cathode on the first anode, and the second sub OLED is composed of the second anode and the OLED functional layer and the cathode on the second anode; for each one of the pixel areas, a pixel driving circuit is formed correspondingly; the pixel driving circuit is coupled to the first anode and the second anode, respectively; when operated, the pixel driving circuit sends the first current and the second current different from the first current to the first anode and the second anode so that the luminance strength of the first sub OLED and the second sub OLED is the same through controlling values of the first current and the second current, and the problem of uneven luminance strength due to uneven thickness of the OLED functional layer due to forming the OLED functional layer by printing method is solved, and the display quality is improved. The driving method of AMOLED display device makes the luminance strength in each pixel area to be even when the AMOLED display device is operated, and improves the display quality of the AMOLED display device, Various changes or modifications can be made to the descriptions above in accordance with the technique solutions and concepts by one with ordinary skill in the art, and the changes and modifications should be within the protected scope of the claims of the present invention.

What is claimed is:

1. An AMOLED display device, comprising: a TFT substrate; a plurality of pixel separating banks arranged on the TFT substrate, a plurality of OLED functional layers arranged on the TFT substrate; and a cathode arranged on the OLED functional layers; wherein, the pixel separating banks defines a plurality of pixel areas on the TFT substrate, and the OLED functional layers are formed on the pixel areas, respectively;

wherein, the TFT substrate comprises a substrate; a TFT array layer formed on the substrate; and a plurality of anode layers formed on the TFT array layer and correspondingly on the pixel areas;

wherein, each anode layer comprises: a first anode formed on center of a corresponding one of the pixel areas; and a second anode separated from and formed around the first anode; wherein a first sub OLED is composed of the first anode and the OLED functional layer and the cathode on the first anode, and a second sub OLED is composed of the second anode and the OLED functional layer and the cathode on the second anode;

wherein, for each one of the pixel areas, a pixel driving circuit is formed correspondingly in the AMOLED display device; the pixel driving circuit is electrically coupled to the first anode and the second anode, respectively; and, when the AMOLED display device is operated, the pixel driving circuit is used to send a first current and a second current to the first anode and the second anode, respectively, to drive the first sub OLED and the second sub OLED to illuminate light to keep luminance strength of the first sub OLED and the second sub OLED to be the same;

wherein materials forming the pixel separating banks are hydrophilic, a thickness of the OLED functional layer corresponding to the first anode is smaller than the thickness of the OLED functional layer corresponding to the second anode; and the first current is smaller than the second current.

2. The AMOLED display device as claimed in claim 1, wherein each pixel driving circuit comprises a first TFT, a second TFT, a third TFT, a fourth TFT, a first capacitor and a second capacitor;
   wherein the first TFT, the second TFT, the third TFT, the fourth TFT, the first capacitor and the second capacitor are in the TFT array layer; a gate of the first TFT is coupled to receive a scan signal, a source of the first TFT is coupled to receive a first data signal, and a drain of the first TFT is electrically coupled to a gate of the second TFT; a drain of the second TFT is coupled to receive a positive power source, and a source of the second TFT is electrically coupled to the first anode in the corresponded pixel area; a gate of the third TFT is electrically coupled to the gate of the first TFT, a source of the third TFT is coupled to receive a second data signal, and a drain of the third TFT is electrically coupled to a gate of the fourth TFT; a drain of the fourth TFT is coupled to receive the positive power source, and a source of the fourth TFT is electrically coupled to the second anode in the corresponded pixel area; two terminals of the first capacitor are electrically coupled to the gate and the drain of the second TFT, respectively; and two terminals of the second capacitor are electrically coupled to the gate and the drain of the fourth TFT;
   the cathode is coupled to receive a negative power source;
   when the AMOLED display device is operated, the first TFT and the third TFT are turned on by the scan signal, and the first current and the second current are generated and are fed to the first anode and the second anode, respectively, in correspondence to inputting the first data signal and the second data signal to the gate of the second TFT and the gate of the fourth TFT, respectively.

3. The AMOLED display device as claimed in claim 1, wherein the TFT substrate further comprises a planarization layer formed between the anode layers and the TFT array layer.

4. The AMOLED display device as claimed in claim 3, wherein a thickness of an area of the planarization layer corresponding to the first anode is smaller than a thickness of an area of the planarization layer corresponding to the second anode.

5. A driving method of AMOLED display device, comprising:
   step S1, providing an AMOLED display device;
   wherein, the AMOLED display device comprises: a TFT substrate; a plurality of pixel separating banks arranged on the TFT substrate, a plurality of OLED functional layers arranged on the TFT substrate; and a cathode arranged on the OLED functional layers; wherein, the pixel separating banks defines a plurality of pixel areas on the TFT substrate, and the OLED functional layers are formed on the pixel areas, respectively;
   wherein, the TFT substrate comprises a substrate; a TFT array layer formed on the substrate; and a plurality of anode layers formed on the TFT array layer and correspondingly on the pixel areas;
   wherein, each anode layer comprises: a first anode formed on center of a corresponding one of the pixel areas; and a second anode separated from and formed around the first anode; wherein a first sub OLED is composed of the first anode and the OLED functional layer and the cathode on the first anode, and a second sub OLED is composed of the second anode and the OLED functional layer and the cathode on the second anode;
   wherein, for each one of the pixel areas, a pixel driving circuit is formed correspondingly in the AMOLED display device; the pixel driving circuit is electrically coupled to the first anode and the second anode, respectively; and
   step S2, displaying by the AMOLED display device, wherein the pixel driving circuit sends a first current and a second current to the first anode and the second anode, respectively, to drive the first sub OLED and the second sub OLED to illuminate light to keep luminance strength of the first sub OLED and the second sub OLED to be the same;
   wherein materials forming the pixel separating banks are hydrophilic, a thickness of the OLED functional layer corresponding to the first anode is smaller than the thickness of the OLED functional layer corresponding to the second anode; and the first current is smaller than the second current in the step S2.

6. The driving method as claimed in claim 5, wherein each pixel driving circuit comprises a first TFT, a second TFT, a third TFT, a fourth TFT, a first capacitor and a second capacitor;
   wherein the first TFT, the second TFT, the third TFT, the fourth TFT, the first capacitor and the second capacitor are in the TFT array layer; a gate of the first TFT is coupled to receive a scan signal, a source of the first TFT is coupled to receive a first data signal, and a drain of the first TFT is electrically coupled to a gate of the second TFT; a drain of the second TFT is coupled to receive a positive power source, and a source of the second TFT is electrically coupled to the first anode in the corresponded pixel area; a gate of the third TFT is electrically coupled to the gate of the first TFT, a source of the third TFT is coupled to receive a second data signal, and a drain of the third TFT is electrically coupled to a gate of the fourth TFT; a drain of the fourth TFT is coupled to receive the positive power source, and a source of the fourth TFT is electrically coupled to the second anode in the corresponded pixel area; two terminals of the first capacitor are electrically coupled to the gate and the drain of the second TFT, respectively; and two terminals of the second capacitor are electrically coupled to the gate and the drain of the fourth TFT;
   the cathode is coupled to receive a negative power source;
   in the step S2, when the AMOLED display device is operated, the first TFT and the third TFT are turned on by the scan signal, and the first current and the second current are generated and are fed to the first anode and the second anode, respectively, in correspondence to inputting the first data signal and the second data signal to the gate of the second TFT and the gate of the fourth TFT, respectively.

7. An AMOLED display device, comprising: a TFT substrate; a plurality of pixel separating banks arranged on the TFT substrate, a plurality of OLED functional layers arranged on the TFT substrate; and a cathode arranged on the OLED functional layers; wherein, the pixel separating banks defines a plurality of pixel areas on the TFT substrate, and the OLED functional layers are formed on the pixel areas, respectively;
   wherein, the TFT substrate comprises a substrate; a TFT array layer formed on the substrate; and a plurality of anode layers formed on the TFT array layer and correspondingly on the pixel areas;
   wherein, each anode layer comprises: a first anode formed on center of a corresponding one of the pixel areas; and a second anode separated from and formed around the first anode; wherein a first sub OLED is composed of the first anode and the OLED functional layer and the cathode on the first anode, and a second sub OLED is composed of the second anode and the OLED functional layer and the cathode on the second anode;

wherein, for each one of the pixel areas, a pixel driving circuit is formed correspondingly in the AMOLED display device; the pixel driving circuit is electrically coupled to the first anode and the second anode, respectively; and, when the AMOLED display device is operated, the pixel driving circuit is used to send a first current and a second current to the first anode and the second anode, respectively, to drive the first sub OLED and the second sub OLED to illuminate light to keep luminance strength of the first sub OLED and the second sub OLED to be the same;

wherein materials forming the pixel separating banks are hydrophilic, a thickness of the OLED functional layer corresponding to the first anode is smaller than the thickness of the OLED functional layer corresponding to the second anode; and the first current is smaller than the second current;

wherein each pixel driving circuit comprises a first TFT, a second TFT, a third TFT, a fourth TFT, a first capacitor and a second capacitor;

wherein the first TFT, the second TFT, the third TFT, the fourth TFT, the first capacitor and the second capacitor are in the TFT array layer; a gate of the first TFT is coupled to receive a scan signal, a source of the first TFT is coupled to receive a first data signal, and a drain of the first TFT is electrically coupled to a gate of the second TFT; a drain of the second TFT is coupled to receive a positive power source, and a source of the second TFT is electrically coupled to the first anode in the corresponded pixel area; a gate of the third TFT is electrically coupled to the gate of the first TFT, a source of the third TFT is coupled to receive a second data signal, and a drain of the third TFT is electrically coupled to a gate of the fourth TFT; a drain of the fourth TFT is coupled to receive the positive power source, and a source of the fourth TFT is electrically coupled to the second anode in the corresponded pixel area; two terminals of the first capacitor are electrically coupled to the gate and the drain of the second TFT, respectively; and two terminals of the second capacitor are electrically coupled to the gate and the drain of the fourth TFT;

the cathode is coupled to receive a negative power source;

when the AMOLED display device is operated, the first TFT and the third TFT are turned on by the scan signal, and the first current and the second current are generated and are fed to the first anode and the second anode, respectively, in correspondence to inputting the first data signal and the second data signal to the gate of the second TFT and the gate of the fourth TFT, respectively;

wherein the TFT substrate further comprises a planarization layer formed between the anode layers and the TFT array layer;

wherein a thickness of an area of the planarization layer corresponding to the first anode is smaller than a thickness of an area of the planarization layer corresponding to the second anode.

* * * * *